(12) United States Patent
Paredes et al.

(10) Patent No.: US 7,073,106 B2
(45) Date of Patent: Jul. 4, 2006

(54) TEST METHOD FOR GUARANTEEING FULL STUCK-AT-FAULT COVERAGE OF A MEMORY ARRAY

(75) Inventors: Jose A. Paredes, Austin, TX (US); Philip G. Shephard, III, Round Rock, TX (US); Timothy M. Skergan, Austin, TX (US); Neil R. Vanderschaaf, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 10/392,665

(22) Filed: Mar. 19, 2003

(65) Prior Publication Data

US 2004/0199816 A1    Oct. 7, 2004

(51) Int. Cl.
    *G11C 29/00*    (2006.01)
(52) U.S. Cl. .................. 714/720; 714/718; 365/201
(58) Field of Classification Search .................. None
    See application file for complete search history.

(56) References Cited

U.S. PATENT DOCUMENTS

| | | | |
|---|---|---|---|
| 4,625,310 A | 11/1986 | Mercer | 371/15 |
| 4,680,760 A | 7/1987 | Giles et al. | 371/21 |
| 4,937,765 A | 6/1990 | Shupe et al. | 364/570 |
| 5,138,619 A | 8/1992 | Fasang et al. | 371/21.1 |
| 5,222,066 A | 6/1993 | Grula et al. | 371/21.1 |
| 5,483,543 A | 1/1996 | Hosokawa et al. | 371/23 |
| 5,726,997 A | 3/1998 | Teene | 371/22.3 |
| 6,018,813 A | 1/2000 | Chakradhar et al. | 714/724 |
| 6,061,808 A * | 5/2000 | Yamauchi et al. | 714/6 |
| 6,065,145 A | 5/2000 | Bencivenga | 714/724 |
| 6,259,639 B1 * | 7/2001 | Hashizume | 365/201 |
| 6,553,329 B1 * | 4/2003 | Balachandran | 702/118 |
| 2004/0199816 A1 * | 10/2004 | Paredes et al. | 714/25 |

\* cited by examiner

*Primary Examiner*—Phung My Chung
(74) *Attorney, Agent, or Firm*—Robert A. Voigt, Jr.; Winstead Sechrest & Minick P.C.; Casimer K. Salys

(57) ABSTRACT

A method, computer program product and system for testing stuck-at-faults. A first register may be loaded with a first value where the first value may be written into each entry in a memory array. A second register may be loaded with a second value. A third register may be loaded with either the second value or a third value. The second and third values are pre-selected to test selector circuits for stuck-at-faults with a pattern where the pattern includes a set of bits to be inputted to selector circuits and a set of bits to be stored in the memory cells. A value stored in the n-most significant bits in both the second and third registers may be predecoded to produce a predecode value. The predecode value may be compared with the value stored in the n-most significant bits in an entry in the memory array to determine a stuck-at-fault.

36 Claims, 9 Drawing Sheets

Fig. 5

INITIAL STATE:

```
                                CARRY GEN BITS
         MSB                              LSB
      RA 0 0 0 0 0 0 0 0 | 1 1 1 ... 1
      RB 0 0 0 0 0 0 0 0 | 0 0 0 ... 0
```

ENTRY IN MEMORY ARRAY    0 0 0 0 0 0 0 0

MATCH:

| E00 | E01 | E10 | E11 | t | tp | REQT. INDEX |
|---|---|---|---|---|---|---|
| 0 | 0 | 1 | 1 | 0 | 0 | a |

SWEEP:

```
                      SWEEP LEFT    CARRY GEN BITS
         MSB            ←┐                    LSB
      RA 0 0 0 0 [1] 1 1 1 | 1 1 1 ... 1
      RB 0 0 0 0  0  0 0 0 | 0 0 0 ... 0

0 0 0 0 0 0 0 0
                 ↑
      SET 201A PULLDOWN THIS COLUMN ONLY
```

MIS-MATCH:

| E00 | E01 | E10 | E11 | t | tp | REQT. INDEX |
|---|---|---|---|---|---|---|
| 1 | 0 | 0 | 1 | 0 | 0 | 5 |

FINAL STATE:

```
                                CARRY GEN BITS
         MSB                              LSB
      RA 1 1 1 1 1 1 1 1 | 1 1 1 ... 1
      RB 0 0 0 0 0 0 0 0 | 0 0 0 ... 1
```

ENTRY IN MEMORY ARRAY    0 0 0 0 0 0 0 0

MATCH:

| E00 | E01 | E10 | E11 | t | tp | REQT. INDEX |
|---|---|---|---|---|---|---|
| 0 | 1 | 1 | 0 | 0 | 0 | 1 |

Fig. 6

INITIAL STATE:

```
                          MSB                    CARRY GEN BITS
                                                              LSB
                       RA  0 0 0 0 0 0 0 0 | 0 1 1 ... 1
                       RB  0 1 0 1 0 1 0 1 | 0 1 0 ... ?
```

ENTRY IN MEMORY ARRAY    0 1 0 1 0 1 0 1

MATCH:

| E00 | E01 | E10 | E11 | t | tp | REQT. INDEX | COL. INDEX |
|-----|-----|-----|-----|---|----|-------------|-----------|
| 1   | 0   | 0   | 1   | 0 | 1  | 3           | even      |
| 1   | 1   | 0   | 0   | 1 | 0  | c           | odd       |

SWEEP:

```
                          MSB    SWEEP LEFT      CARRY GEN BITS
                                   ◄─┐                        LSB
                       RA  0 0 0 0 [1] 1 1 1 | 1 1 1 ... 1
                       RB  0 1 0 1  0  1 0 1 | 0 1 0 ... 0
```

ENTRY IN MEMORY ARRAY    0 1 0 1 0 1 0 1
   SET 201B (EVEN)        ↑   ↑   ↑   ↑
   SET 201C (ODD)      ↑   ↑   ↑

MIS-MATCH:  ONE SET AT A TIME IS ACTIVATED AS SWEEP PROGRESSES

| E00 | E01 | E10 | E11 | t | tp | REQT. INDEX | COL. INDEX |
|-----|-----|-----|-----|---|----|-------------|-----------|
| 1   | 1   | 0   | 0   | 0 | 1  | 6           | even      |
| 0   | 1   | 1   | 0   | 1 | 0  | 7           | odd       |

FINAL STATE:

```
                          MSB                    CARRY GEN BITS
                                                              LSB
                       RA  1 1 1 1 1 1 1 1 | 1 1 1 ... 1
                       RB  0 1 0 1 0 1 0 1 | 0 1 0 ... ?
```

ENTRY IN MEMORY ARRAY    0 1 0 1 0 1 0 1

MATCH:

| E00 | E01 | E10 | E11 | t | tp | REQT. INDEX | COL. INDEX |
|-----|-----|-----|-----|---|----|-------------|-----------|
| 0   | 0   | 1   | 1   | 0 | 1  | b           | even      |
| 1   | 0   | 0   | 1   | 1 | 0  | 4           | odd       |

Fig. 7

INITIAL STATE:

```
                           MSB                    CARRY GEN BITS    LSB
                        RA  0 0 0 0 0 0 0 0      0 1 1 ... 1
                        RB  1 0 1 0 1 0 1 0      1 0 1 ... ?
```

ENTRY IN MEMORY ARRAY     1 0 1 0 1 0 1 0

MATCH:

| E00 | E01 | E10 | E11 | t | tp | REQT. INDEX | COL. INDEX |
|-----|-----|-----|-----|---|----|-------------|------------|
| 1   | 1   | 0   | 0   | 1 | 0  | c           | even       |
| 1   | 0   | 0   | 1   | 0 | 1  | 3           | odd        |

SWEEP:

```
                              SWEEP LEFT           CARRY GEN BITS
                           MSB    ←                              LSB
                        RA  0 0 0 0 [1] 1 1 1    1 1 1 ... 1
                        RB  1 0 1 0 1 0 1 0      1 0 1 ... ?
```

ENTRY IN MEMORY ARRAY     1 0 1 0 1 0 1 0
SET 201B (ODD)                ↑   ↑   ↑   ↑
SET 201C (EVEN)             ↑   ↑   ↑   ↑

MIS-MATCH:   ONE AT A TIME IS ACTIVATED AS SWEEP PROGRESSES

| E00 | E01 | E10 | E11 | t | tp | REQT. INDEX | COL. INDEX |
|-----|-----|-----|-----|---|----|-------------|------------|
| 0   | 1   | 1   | 0   | 1 | 0  | 7           | even       |
| 1   | 1   | 0   | 0   | 0 | 1  | 6           | odd        |

FINAL STATE:

```
                           MSB                    CARRY GEN BITS    LSB
                        RA  1 1 1 1 1 1 1 1      1 1 1 ... 1
                        RB  1 0 1 0 1 0 1 1      1 0 1 ... ?
```

ENTRY IN MEMORY ARRAY     1 0 1 0 1 0 1 0

MATCH:

| E00 | E01 | E10 | E11 | t | tp | REQT. INDEX | COL. INDEX |
|-----|-----|-----|-----|---|----|-------------|------------|
| 1   | 0   | 0   | 1   | 1 | 0  | 4           | even       |
| 0   | 0   | 1   | 1   | 0 | 1  | b           | odd        |

Fig. 8

INITIAL STATE:

```
                                        CARRY GEN BITS
                    MSB                              LSB
                 RA  0 0 0 0 0 0 0 0 | 0 0 0 ... 0
                 RB  1 1 1 1 1 1 1 1 | 1 1 1 ... 1
```

ENTRY IN MEMORY ARRAY       1 1 1 1 1 1 1 1

MATCH:

| E00 | E01 | E10 | E11 | t | tp | REQT. INDEX |
|-----|-----|-----|-----|---|----|-------------|
| 0   | 1   | 1   | 0   | 1 | 1  | 2           |

SWEEP:

```
                         SWEEP LEFT      CARRY GEN BITS
                    MSB      ←               LSB
                 RA  0 0 0 0 [1] 1 1 1 | 1 1 1 ... 1
                 RB  1 1 1 1  1  1 1 1 | 1 1 1 ... 1
```

ENTRY IN MEMORY ARRAY       1 1 1 1 1 1 1 1
                                  ↑
                    SET 201D PULLDOWN THIS COLUMN ONLY

MIS-MATCH:

| E00 | E01 | E10 | E11 | t | tp | REQT. INDEX |
|-----|-----|-----|-----|---|----|-------------|
| 0   | 0   | 1   | 1   | 1 | 1  | 8           |

FINAL STATE:

```
                                        CARRY GEN BITS
                    MSB                              LSB
                 RA  1 1 1 1 1 1 1 1 | 1 1 1 ... 1
                 RB  1 1 1 1 1 1 1 1 | 1 1 1 ... 1
```

ENTRY IN MEMORY ARRAY       1 1 1 1 1 1 1 1

MATCH:

| E00 | E01 | E10 | E11 | t | tp | REQT. INDEX |
|-----|-----|-----|-----|---|----|-------------|
| 1   | 1   | 0   | 0   | 1 | 1  | d           |

TEST METHOD FOR GUARANTEEING FULL STUCK-AT-FAULT COVERAGE OF A MEMORY ARRAY

TECHNICAL FIELD

The present invention relates to the field of testing memory arrays, and more particularly to providing a method for guaranteeing full stuck-at-fault coverage of a content addressable memory array whose cell contents are associated with a selector circuit configured to detect matching or mismatching of the cell contents.

BACKGROUND INFORMATION

A memory unit accessed by content, rather than by address or location, is called an associative memory or Content Addressable Memory (CAM). A CAM may comprise an array of memory cells arranged in a row and column format. The content in each memory cell may be compared using comparison circuitry, e.g., a comparator, associated with each memory cell. Since the content in each memory cell is compared, the entire memory is compared. By comparing the entire memory, the data content may be randomly stored without regard to an addressing scheme which would otherwise be required.

Traditionally, each memory cell in the CAM stores one bit of digital information. In some CAMs, each memory cell may include "dual ended" logic, such that the memory cell makes available both the true state and the complement state of the stored digital information. The true state and complement state of the stored digital information may be used by a comparison circuit embedded within a memory cell to determine if the contents of that memory cell matches an input, e.g., field in an instruction storing a source address. A comparison circuit may be designed with a plurality of what are commonly referred to as "legs" or "sets" where each set comprises a plurality of transistors as discussed further below in the detailed description section in conjunction with FIG. 1.

Logic circuits, including memory arrays, are often tested for what is commonly referred to as "stuck-at-faults." Stuck-at-faults may refer to a transistor being stuck in a particular state, e.g., low state represented by 0 or a high state represented by the binary digit 1. If one of the transistors in the comparison circuit suffered from a stuck-at-fault, then the comparison circuit may incorrectly indicate whether a match or mismatch occurred.

Consequently, there is a need in the art for testing the comparison circuit guaranteeing full stuck-at-fault coverage of a content addressable memory array whose cell contents are associated with a comparison circuit configured to detect matching or mismatching of the cell contents.

SUMMARY

The problems outlined above may at least in part be solved in some embodiments by loading a first register configured to store the contents for a row of a memory array with a first value. The first value stored in the first register may be written to each entry in the memory array. A second register may be loaded with a second value. A third register may be loaded with either the second value or a third value. The second and third registers may be configured to store a base and an offset address that may be used to determine a source or a destination address. A value in particular bit positions in the second and third registers may be inputted to one of a plurality of predecode units. Each predecode unit may be configured to decode the inputs into output signals that are inputted to a particular selector circuit. Each selector circuit may be configured to compare the contents of memory cells embedded with the selector circuit. The second and third values are pre-selected to test the selector circuits for stuck-at-faults with a pattern where the pattern comprises a first set of bits to be inputted to the selector circuits and a second set of bits to be stored in the memory cells embedded with the selector circuits. A value stored in the n-most significant bits in the second register as well as a value stored in the n-most significant bits in the third register may be predecoded and compared to the value stored in the n-most significant bits in an entry in the memory array. A stuck-at-fault may be determined based on the comparison.

In one embodiment of the present invention, a method for testing stuck-at-faults in circuitry configured to determine matching of memory cells may comprise the step of loading a first register with a first value where the first register is configured to store contents for a row of a memory array. The first value may be written into an entry in the memory array. The method may further comprise loading a second register with a second value and loading a third register with either the second value or a third value. The second and third values are pre-selected to test selector circuits for stuck-at-faults with a pattern where the selector circuits may be configured to determine matching of memory cells contents in the memory array. The pattern may comprise a first set of bits to be inputted to the selector circuits and a second set of bits to be stored in the memory cells embedded with the selector circuits. A value stored in the n-most significant bits in the second register and the value stored in the n-most significant bits in the third register may be predecoded to produce a predecode value. The predecode value may be compared with the value stored in the n-most significant bits in the entry in the memory array. A stuck-at-fault may be determined based on the comparison.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which:

FIGS. 5–8 illustrate testing selector circuits using various test patterns in accordance with the present invention.

DETAILED DESCRIPTION

The present invention comprises a method, computer program product and system for testing stuck-at-faults in circuitry configured to determine matching of memory cell contents. In one embodiment of the present invention, a first register configured to store the contents for a row of a memory array may be loaded with a first value. The first value may be written into each entry in the memory array. A second register may be loaded with a second value. A third register may be loaded with either the second value or a third value. The second and third registers may be configured to store a base and an offset address that may be used to determine a source or a destination address. A value in particular bit positions in the second and third registers may be inputted to one of a plurality of predecode units. Each predecode unit may be configured to decode the inputs into output signals that are inputted to a particular selector circuit. Each selector circuit may be configured to compare the contents of memory cells embedded with the selector circuit. The second and third values are pre-selected to test the selector circuits for stuck-at-faults with a pattern where the pattern comprises a first set of bits to be inputted to the selector circuits and a second set of bits to be stored in the memory cells embedded with the selector circuits. A value stored in the n-most significant bits in the second register and the value stored in the n-most significant bits in the third register may be predecoded to produce a predecode value. The predecode value is compared with the value stored in the n-most significant bits in entry in the memory array. A stuck-at-fault may be determined based on the comparison.

Figure 1:
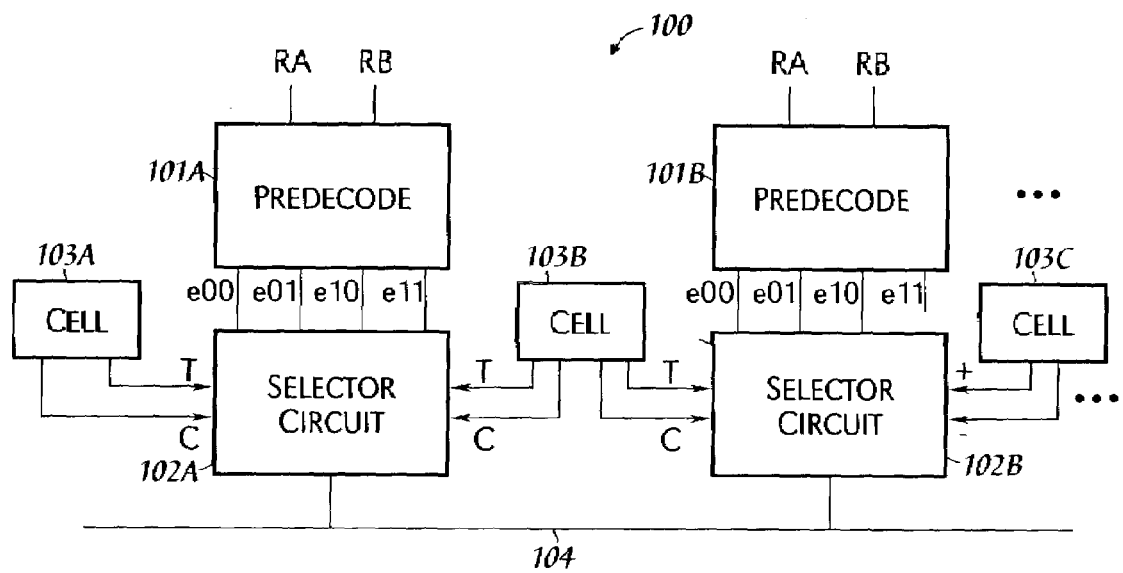
FIG. 1 illustrates a content addressable memory configured in accordance with the present invention.

FIG. 1—Content Addressable Memory (CAM)

FIG. 1 illustrates an embodiment of the present invention of a Content Addressable Memory (CAM) 100. CAM 100 may comprise a plurality of predecode units 101A–B where each predecode unit 101A–B may receive a value stored in multiple bits, e.g., two bits, from particular fields, e.g., RA and RB, storing a base and an offset address that may be used to determine a source or a destination address. For example, predecode unit 101A may receive the value stored in the two-most significant bits from the RA and RB fields storing the base and offset address, respectively. Predecode unit 101B may receive the value stored in the second and third most significant bits from the RA and RB fields and so forth. Each predecode unit 101A–B may be configured to decode the inputs into multiple outputs, e.g., e00, e01, e10, e11, that may be inputted to a selector circuit 102A–B, respectively. Each selector circuit 102A–B may be coupled to multiple memory cells 103A–B, 103B–C, respectively. Memory cells 103A–C may be coupled together to form a row of the memory array of CAM 100. Selector circuits 102A–B may be coupled to a line 104, commonly referred to as a match line, to indicate whether there is a match or mismatch in the cell contents of memory cells 103A–B, 103B–C, respectively. Predecode units 101A–B may collectively or individually be referred to as predecode units 101 or predecode unit 101, respectively. Selector circuits 102A–B may collectively or individually be referred to as selector circuits 102 or selector circuit 102, respectively. Memory cells 103A–C may collectively or individually be referred to as memory cells 103 or memory cell 103, respectively. It is noted that CAM 100 may comprise any number of predecode units 101, selector circuits 102 and cells 103 and that FIG. 1 is illustrative.

Referring to FIG. 1, each memory cell 103 may make available both the true state and the complement state of the stored digital information. Selector circuit 102 may then be configured to determine if there is a match or mismatch of the cell contents of memory cells 103 with respect to the inputs received by the associated predecode unit 101. For example, selector circuit 102A may determine if there is a match between the cell contents of memory cells 103A–B and the inputs to predecode unit 101A. Selector circuit 102B may determine if there is a match between the cell contents of memory cells 103B–C and the inputs to predecode unit 101B. In one embodiment, if selector circuit 102 determines there to be a mismatch, then selector circuit 102 may pull down line 104. If, however, selector circuit 102 determines there to be a match, then line 104 may remain high. It is noted that selector circuit 102 may be configured to pull down line 104 to indicate a match and to allow line 104 to remain high to indicate a mismatch and that such embodiments would fall within the scope of the present invention. A more detailed description of selector circuit 102 is provided below in conjunction with FIG. 2.

Figure 2:
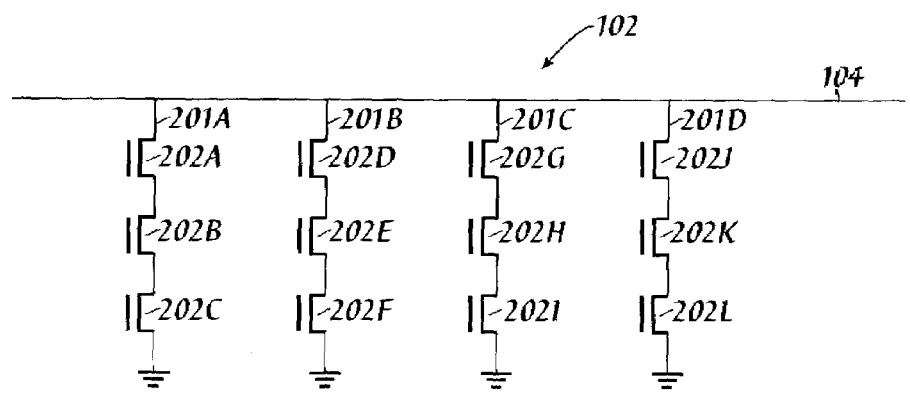
FIG. 2 illustrates a selector circuit in the content addressable memory configured in accordance with the present invention.

FIG. 2—Selector Circuit

FIG. 2 illustrates an embodiment of the present invention of selector circuit 102 comprising four sets 201A–D of serially connected transistors. Each set 201A–D may comprise three serially connected transistors 202A–C, 202D–F, 202G–I, 202J–L, respectively. Sets 201A–D may collectively or individually be referred to as sets 201 or set 201, respectively. Transistors 202A–L may collectively or individually be referred to as transistors 202 or transistor 202, respectively. It is noted that selector circuit 102 may comprise any number of sets 201 where each set 201 may comprise a different number of serially connected transistors 202 than illustrated. It is further noted that FIG. 2 is illustrative.

Referring to FIG. 2, if selector circuit 102 detects a mismatch in the cell contents with respect to the inputs received by the associated predecode unit 101, then one or more sets 201 may pull down line 104 thereby indicating a mismatch. A set 201 may pull down line 104 when all transistors 202 in that set 201 are activated, i.e., turned on. If, however, selector circuit 102 does not detect a mismatch in the cell contents, then line 104 remains charged to a pre-selected voltage. This may occur when not all of transistors 202 in set 201 are activated.

As stated in the Background Information section, memory arrays are often tested for what is commonly referred to as "stuck-at-faults." Stuck-at-faults may refer to a transistor being stuck in a particular state, e.g., low state represented by 0 or a high state represented by the binary digit 1. If one of transistors 202, e.g., transistor 202A, in set 201, e.g., set 201A, of selector circuit 102 suffered from a stuck-at-fault, then selector circuit 102 may incorrectly indicate whether a match or mismatch occurred. Selector circuit 102 may incorrectly indicate a match when all of the transistors 202 in set 201 should be activated, i.e., turned on, but are not activated. Further, selector circuit 102 may incorrectly indicate a mismatch when all of the transistors 202 in set 201 should not be activated but are activated. Consequently, there is a need in the art for testing selector circuit 102 guaranteeing full stuck-at-fault coverage. Stuck-at-faults in selector circuit 102 may be detected by testing each set 201 in selector circuit 102 during the cases of when only one transistor 202 in set 201 should be deactivated and the other transistors 202 in set 201 should be activated or when all of transistors 202 in set 201 should be activated. These cases may be tested using various patterns of interest as described further below in conjunction with FIGS. 3 and 4. A method for generating a pattern used to test selector circuit 102 for stuck-at-faults is discussed below in conjunction with FIG. 3. A method for testing stuck-at-faults in selector circuit 102 is discussed further below in conjunction with FIG. 4.

Figure 3:
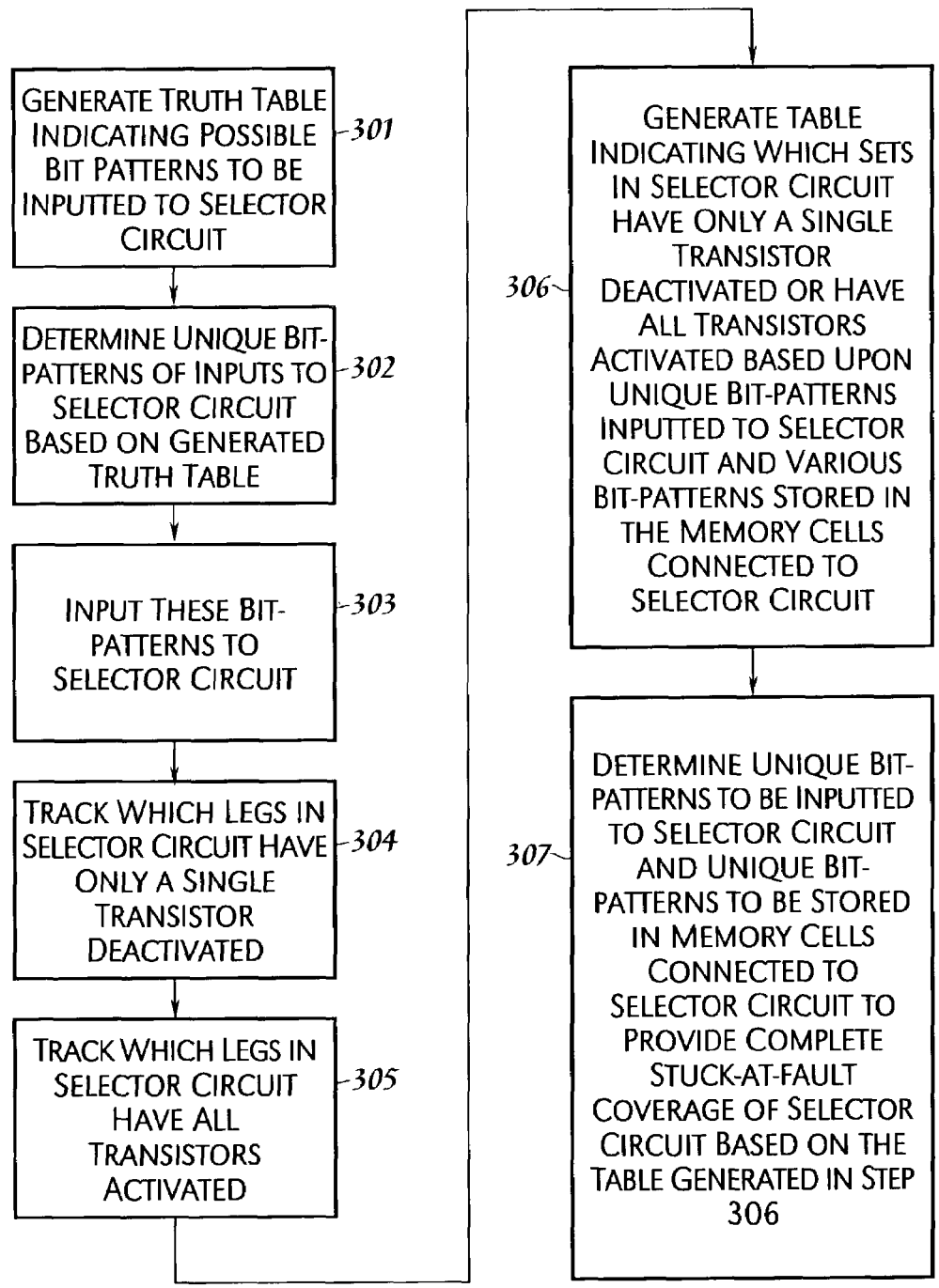
FIG. 3 is a flowchart of a method for generating a test pattern used to test stuck-at-faults in selector circuits in accordance with the present invention.

FIG. 3—Method for Generating a Test Pattern

FIG. 3 is a flowchart of one embodiment of the present invention of a method 300 for generating a test pattern used to test stuck-at-faults in selector circuit 102 (FIGS. 1 and 2).

Referring to FIG. 3, in conjunction with FIGS. 1 and 2, in step 301, a truth table indicating the possible bit patterns for the output, e.g., e00, e01, e10, e11, of predecode unit 101 based upon the various bit combination of inputs, e.g., RA, RB, of predecode unit 101 may be generated. The bit patterns for the output, e.g., e00, e01, e10, e11, of predecode unit 101, e.g., predecode unit 101A, may be inputted to the associated selector circuit 102, e.g., selector circuit 102A. In one embodiment, the bit patterns for the output of predecode unit 101 may be generated from the following equations:

$$gt(i) = (ra(i) \text{ AND } rb(i)) \tag{EQ1}$$

$$gc(i) = (\text{NOT } (ra(i) \text{ AND } rb(i))) \tag{EQ2}$$

$$pt(i) = (ra(i) \text{ OR } rb(i)) \tag{EQ3}$$

$$pc(i) = (\text{NOT } (ra(i) \text{ OR } rb(i))) \tag{EQ4}$$

$$pxt(i) = (ra(i) \text{ XOR } rb(i)) \tag{EQ5}$$

$$pxc(i) = (\text{NOT } (ra(i) \text{ XOR } rb(i))) \tag{EQ6}$$

$$e00(i-1) = ((pxc(i-1) \text{ AND } pt(i)) \text{ OR } (pxt(i-1) \text{ AND } pc(i))) \tag{EQ7}$$

$$e01(i-1) = ((pxc(i-1) \text{ AND } gt(i)) \text{ OR } (pxt(i-1) \text{ AND } gc(i))) \tag{EQ8}$$

$$e10(i-1) = ((pxc(i-1) \text{ AND } pc(i)) \text{ OR } (pxt(i-1) \text{ AND } pt(i))) \tag{EQ9}$$

$$e11(i-1) = ((pxc(i-1) \text{ AND } gc(i)) \text{ OR } (pxt(i-1) \text{ AND } gt(i))) \tag{EQ10}$$

where ra and rb refer to fields RA and RB above that are inputted to predecode unit 101; where gt(i) refers to the true value of ANDing the current binary values of ra and rb; where gc(i) refers to the complement value of ANDing the current binary values of ra and rb; where pt(i) refers to the true value of ORing the current binary values of ra and rb; where pc(i) refers to the complement value of ORing the current binary values of ra and rb; where pxt(i) refers to XORing the current binary values of ra and rb; where pxc(i) refers to the complement value of XORing the current binary values of ra and rb; where e00(i-1) refers to the value of the output signal e00 of predecode unit 101; where e01(i-1) refers to the value of the output signal e01 of predecode unit 101; where e10(i-1) refers to the value of the output signal e10 of predecode unit 101; and where e11(i-1) refers to the value of the output signal e11 of predecode unit 101.

Based on the equations above, EQ1–10, a truth table indicating the possible bit patterns for the output, e.g., e00, e01, e10, e11, of predecode unit 101 may be generated as illustrated in Table 1 shown below.

TABLE 1

| ra | rb | gt | gc | pt | pc | pxt | pxc |
|----|----|----|----|----|----|-----|-----|
| 0  | 0  | 0  | 1  | 0  | 1  | 0   | 1   |
| 0  | 1  | 0  | 1  | 1  | 0  | 1   | 0   |

TABLE 1-continued

| ra | rb | gt | gc | pt | pc | pxt | pxc |
|----|----|----|----|----|----|-----|-----|
| 1  | 0  | 0  | 1  | 1  | 0  | 1   | 0   |
| 1  | 1  | 1  | 0  | 1  | 0  | 0   | 1   |

In step 302, unique patterns of inputs to selector circuit 102 may be determined based on the table generated in step 301, e.g., Table 1. In one embodiment, another truth table may be generated based on the table generated in step 301, e.g., Table 1, providing information as to the possible states for the output, e.g., e00, e01, e10, e11, of predecode unit 101, that can occur. For example, Table 2 illustrates a table generated based on Table 1 providing information as to the possible states for the output, e.g., e00, e01, e10, e11, of predecode unit 101 as shown below.

TABLE 2

| pxt (i-1) | pxc (i-1) | pt(i) | pc(i) | gt(i) | gc(i) | e00 | e01 | e10 | e11 |
|-----------|-----------|-------|-------|-------|-------|-----|-----|-----|-----|
| 0 | 1 | 0 | 1 | 0 | 1 | 0 | 0 | 1 | 1 |
| 0 | 1 | 0 | 1 | 1 | 0 | X | X | X | X |
| 0 | 1 | 1 | 0 | 0 | 1 | 1 | 0 | 0 | 1 |
| 0 | 1 | 1 | 0 | 1 | 0 | 1 | 1 | 0 | 0 |
| 1 | 0 | 0 | 1 | 0 | 1 | 1 | 1 | 0 | 0 |
| 1 | 0 | 0 | 1 | 1 | 0 | X | X | X | X |
| 1 | 0 | 1 | 0 | 0 | 1 | 0 | 1 | 1 | 0 |
| 1 | 0 | 1 | 0 | 1 | 0 | 0 | 0 | 1 | 1 |

It is noted that X's may refer to states not possible for the outputs, e.g., e00, e01, e10, e11, of predecode unit 101 since the associated pt(i), pc(i), gt(i) and gc(i) entry does not appear in Table 1.

Referring to Table 2, it may be inferred that there are four unique patterns of inputs to selector circuit 102, i.e., unique patterns of bits of e00, e01, e10, e11, as illustrated in Table 2. For example, Table 2 indicates that the possible bit patterns of e00, e01, e10, e11 are 0011, 1001, 1100 and 0110.

In step 303, these bit patterns may be inputted to selector 102. Based on these bit patterns inputted to selector circuit 102 in step 303, each set 201 may be tracked for having only a single transistor 202 deactivated, i.e., turned off, in step 304. Furthermore, based on these bit patterns inputted to selector circuit 102 in step 303, each set 201 may be tracked for having all transistors 202 activated, i.e., turned on, in step 305.

In step 306, a table may be generated indicating which set(s) 201 in selector circuit 102 have only a single transistor 202 deactivated and which set(s) 201 in selector circuit 102 have all the transistors 202 activated based on the unique bit patterns that were inputted to selector circuit 102 in step 303 as well as based on various bit patterns to be stored in memory cells 103, e.g., cell 103A, 103B, connected to selector circuit 102, e.g., selector circuit 102A. For example, Table 3, shown below, illustrates which set(s) 201 in selector circuit 102 have only a single transistor 202 deactivated and which set(s) 201 in selector circuit 102 have all the transistors 202 activated based on the unique bit patterns that were inputted to selector circuit 102 in step 303 as well as based on various bit patterns to be stored in memory cells 103, e.g., cell 103A, 103B, connected to selector circuit 102, e.g., selector circuit 102A.

TABLE 3

| e00 | e01 | e10 | e11 | t | c | tp | cp | List of transistors that are singly deactivated in a set | List of sets with all transistors activated | Reqt. index |
|---|---|---|---|---|---|---|---|---|---|---|
| 0 | 0 | 1 | 1 | 0 | 1 | 0 | 1 | 202A; 202I | | a |
| 0 | 0 | 1 | 1 | 0 | 1 | 1 | 0 | 202D; 202K | | b |
| 0 | 0 | 1 | 1 | 1 | 0 | 0 | 1 | | 201C | 7' |
| 0 | 0 | 1 | 1 | 1 | 0 | 1 | 0 | | 201D | 8 |
| 0 | 1 | 1 | 0 | 0 | 1 | 0 | 1 | 202A; 202F; 202I | | 1 |
| 0 | 1 | 1 | 0 | 0 | 1 | 1 | 0 | | 201B | 6' |
| 0 | 1 | 1 | 0 | 1 | 0 | 0 | 1 | | 201C | 7 |
| 0 | 1 | 1 | 0 | 1 | 0 | 1 | 0 | 202E; 202H; 202J | | 2 |
| 1 | 0 | 0 | 1 | 0 | 1 | 0 | 1 | | 201A | 5 |
| 1 | 0 | 0 | 1 | 0 | 1 | 1 | 0 | 202B; 202D; 202K | | 3 |
| 1 | 0 | 0 | 1 | 1 | 0 | 0 | 1 | 202C; 202G; 202L | | 4 |
| 1 | 0 | 0 | 1 | 1 | 0 | 1 | 0 | | 201D | 8' |
| 1 | 1 | 0 | 0 | 0 | 1 | 0 | 1 | | 201A | 5' |
| 1 | 1 | 0 | 0 | 1 | 0 | 1 | 0 | | 201B | 6 |
| 1 | 1 | 0 | 0 | 1 | 0 | 0 | 1 | 202C; 202G | | c |
| 1 | 1 | 0 | 0 | 1 | 0 | 1 | 0 | 202E; 202J | | d |

Referring to Table 3, columns labeled "e00, e01, e10 and e11" refer to the output values of predecode unit 101. Columns labeled "t" and "c" refer to the true and complement values, respectively, stored in memory cell 103, e.g., memory cell 103B, coupled to the right of selector circuit 102, e.g., selector circuit 102A. Columns labeled "tp" and "cp" refer to the true and complement values, respectively, stored in memory cell 103, e.g., memory cell 103A, coupled to the left of selector circuit 102, e.g., selector circuit 102A. The column entitled "list of transistors that are singly deactivated in a set" refers to transistors 202 that are singly deactivated in set 201 for a unique bit pattern inputted to selector circuit 102, e.g., e00, e01, e10, e11, as well as for a bit pattern, e.g., t, c, tp, cp, stored in memory cells 103, e.g., cell 103A, cell 103B, connected to selector circuit 102. The column entitled "list of sets with all transistors activated" refers to sets 201 that have all transistors 202 activated for a unique bit pattern inputted to selector circuit 102, e.g., e00, e01, e10, e11, as well as for a bit pattern, e.g., t, c, tp, cp, stored in memory cells 103, e.g., cell 103A, 103B, connected to selector circuit 102. The column entitled "Reqt. Index" refers to which bit patterns, e.g., e00, e01, e10, e11, t, c, tp, cp, are required to be inputted to selector circuit 102 and stored in memory cells 103 to provide complete stuck-at-fault coverage of selector circuit 102 as discussed below.

Based on the table generated in step 306, bit patterns to be inputted to selector circuit 102, e.g., e00, e01, e10, e11, as well as bit patterns, e.g., t, c, tp, cp, to be stored in memory cells 103, e.g., cell 103A, 103B, connected to selector circuit 102, e.g., selector circuit 102A, to provide complete stuck-at-fault coverage of selector circuit 102 may be determined in step 307. Referring to Table 3, there are only two bit patterns, e.g., 0110, 1001, to be inputted to selector circuit 102, e.g., e00, 301, e10, e11, that cover all the cases where a single transistor 202 in set 201 is deactivated. These cases are indicated as "1, 2, 3 and 4" in the column labeled "Reqt. Index." Further, the bit patterns to be inputted to selector circuit 102 as well as bit patterns, e.g., t, c, tp, cp, to be stored in memory cells 103, e.g., cell 103A, 103B, connected to selector circuit 102, that cover all the cases where all the transistors 202 in set 201 are activated are indicated as "5, 5', 6, 6', 7, 7', 8 and 8'" in the column labeled "Reqt. Index." A prime (') following the number indicates a duplicate case, i.e., another bit pattern, that may be used to test if all the transistors 202 in a particular set 201 are activated. Since the case where all the transistors 202 in a particular set 201, e.g., set 201A, should be activated needs to be tested only once, either the case identified by a number or a prime following the number needs to be tested. For example, either the case identified by 5 or identified by 5' needs to be tested. Hence, to ensure complete stuck-at-fault coverage of selector circuit 102, the cases identified by 1, 2, 3, 4 as well as cases identified by either 5 or 5', 6 or 6', 7 or 7' and 8 or 8' need to be tested as discussed further below in conjunction with FIG. 4. Redundant coverage may be provided in some of sets 201 as indicated by "a, b, c and d" in the column labeled "Reqt. Index."

It is noted that method 300 may be executed in a different order presented and that the order presented in the discussion of FIG. 3 is illustrative. It is further noted that certain steps in FIG. 3 may be executed almost concurrently. It is further noted that method 300 may be executed by a program of the present invention in a computer system as discussed further below in conjunction with FIG. 9.

Figure 4A:
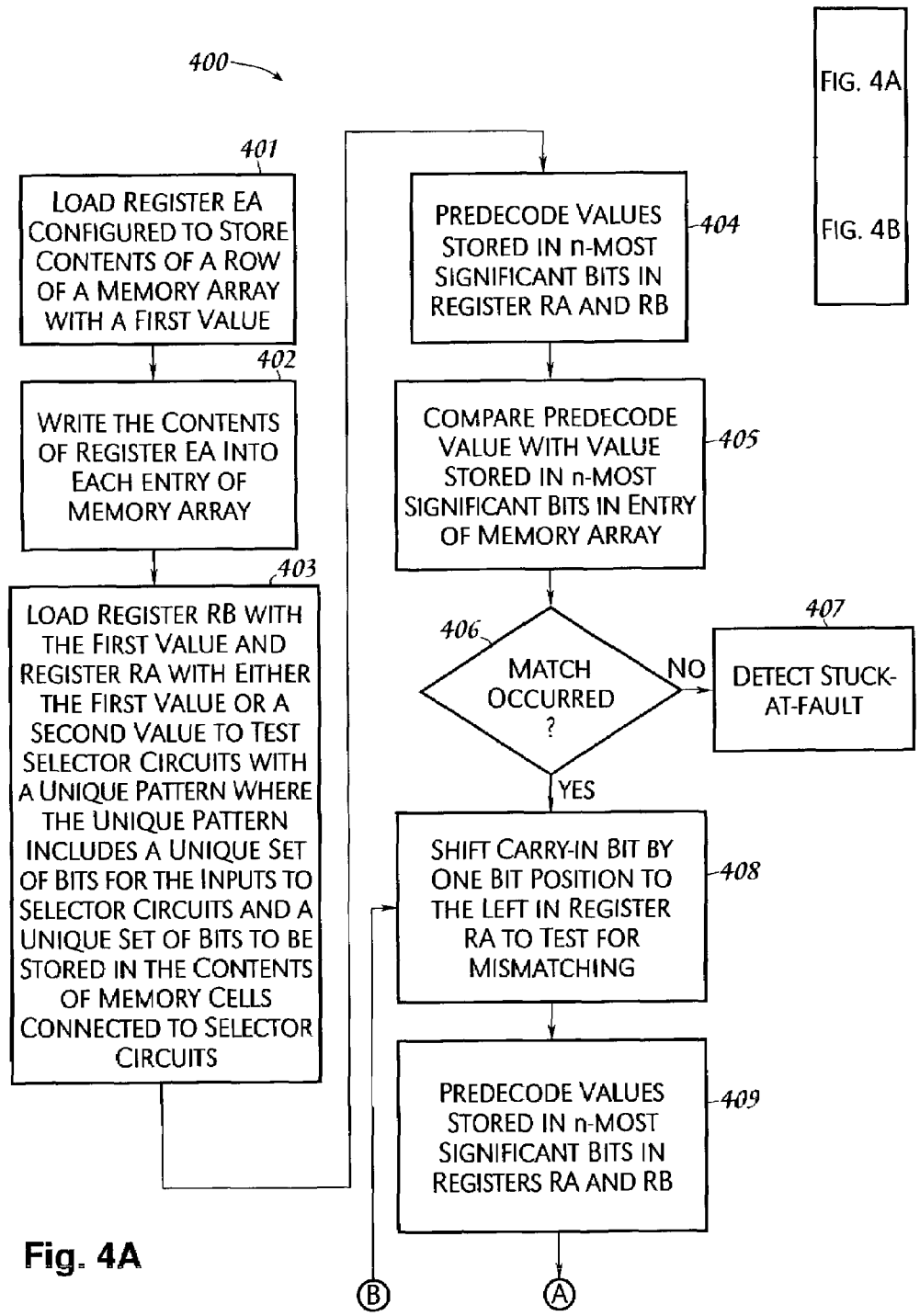
FIG. 4 is a flowchart of a method for testing stuck-at-faults in selector circuits in accordance with the present invention.
Figure 4B:
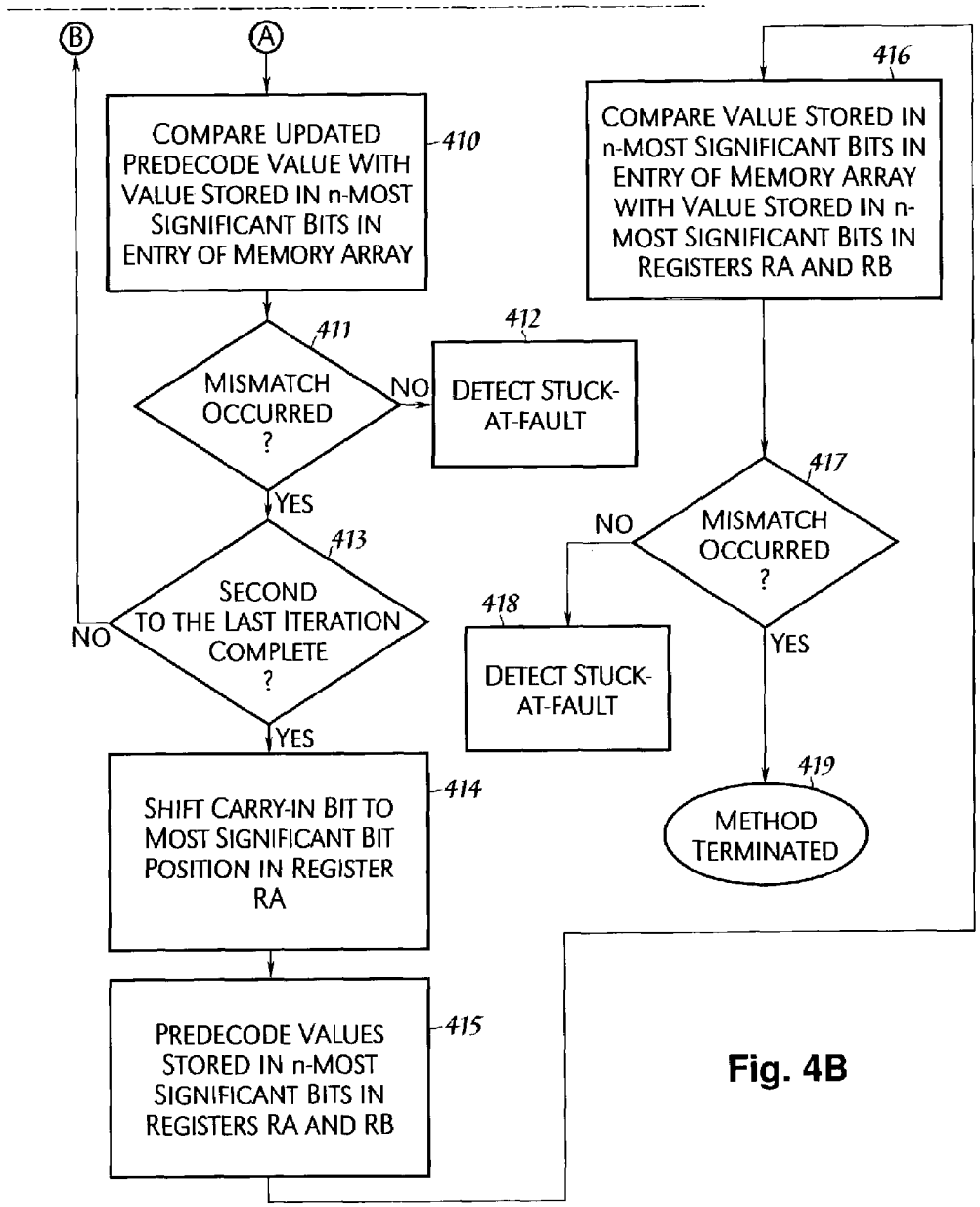

FIG. 4—Method for Testing Stuck-at-Faults in Selector Circuit

FIG. 4 is a flowchart of one embodiment of the present invention of a method 400 for testing stuck-at-faults in selector circuit 102 (FIGS. 1 and 2).

Referring to FIG. 4, in conjunction with FIGS. 1 and 2, in step 401, a register, designated as "EA", configured to store the contents of a row of a memory array in CAM 100, may be loaded with a first value as illustrated in FIGS. 5–8. FIGS. 5–8 illustrate testing cases 1, 2, 3, 4, 5 or 5', 6 or 6', 7 or 7', 8 or 8', a, b, c and d of Table 3 shown above. FIG. 5 illustrates testing cases a and 1 as well as case 5 which tests if all the transistors 202 in set 201A in the appropriate selector circuit 102 are activated as explained in greater detail further below. FIG. 6 illustrates testing cases 3 and b for the evenly located selector circuits 102 and cases c and 4 for the oddly located selector circuits 102. FIG. 6 further illustrates testing case 6 which tests if all the transistors 202 in set 201B located in the evenly located selector circuits 102 are activated and case 7 which tests if all the transistors 202 in set 201C in the oddly located selector circuits 102 are activated as explained in greater detail further below. Evenly located selector circuits 102 refer to selector circuits 102 located in the even position, e.g., second position, fourth position, etc., in CAM 100. Oddly located selector circuits 102 refer to selector circuits 102 located in the odd position, e.g., first position, third position, etc., in CAM 100. FIG. 7 illustrates testing cases 3 and b for the oddly located selector circuits 102 and cases c and 4 for the evenly located selector circuits 102 as well as case 6 which tests if all the transistors 202 in set 201B located in the oddly located selector circuits 102 are activated and case 7 which tests if all the transistors 202 in set 201C located in the evenly located selector circuits 102 are activated as explained in greater detail further below. FIG. 8 illustrates testing cases 2 and d as well as case 8 which tests if all the transistors 202 in set 201D in the appropriate selector circuit 102 are activated as explained in greater detail further below.

In step 402, the contents in register EA may be written to each entry in the memory array. That is, the first value stored in register EA may be written to each row of the memory array in CAM 100 as illustrated in FIGS. 5–8. Referring to FIGS. 5–8, each entry in the memory array may be loaded with a value to test if selector circuit 102 properly indicates a match thereby not pulling down line 104 as discussed below. For example, each entry in the memory array may be loaded with the value of 00000000 to satisfy requirements "a" and "1" as illustrated in FIG. 5. Each entry in the memory array may be loaded with a value of 01010101 to satisfy requirements "3" and "b" for the evenly located selector circuits 102 and requirements "c" and "4" for the oddly located selector circuits 102 as illustrated in FIG. 6. Each entry in the memory array may be loaded with a value of 10101010 to satisfy requirements "3" and "b" for the oddly located selector circuits 102 and requirements "c" and "4" for the evenly located selector circuits 102 as illustrated in FIG. 7. Each entry in the memory array may be loaded with a value of 11111111 to satisfy requirements "d" and "2" as illustrated in FIG. 8. It is noted that register EA may be any length and that the value loaded in each entry in the memory array from register EA may be a different length than illustrated. It is further noted that FIGS. 5–8 are illustrative.

Returning to FIG. 4, in step 403, the registers storing input fields RA and RB, designated as "RA" and "RB", respectively, as illustrated in FIGS. 5–8, may be loaded with different values to test selector circuits 102 with a unique pattern where the pattern includes a set of bits, e.g., e00, e01, e10, e11, to be inputted to selector circuits 102 and a set of bits, e.g., t, tp, to be stored in the contents of memory cells 103 coupled to selector circuits 102. As stated above, input fields RA and RB may store the base and offset address, respectively, that may be used to determine a source or destination address. A value stored in multiple bits, e.g., two bits, from input fields RA and RB may be inputted to a particular predecode unit 101. Particular values may be pre-selected to be loaded in registers RA, RB in order to test selector circuits 102 with unique patterns which vary depending on the case to be tested on selector circuits 102. In one embodiment of the present invention, register RB may be loaded with the same value as loaded in register EA as described below. In another embodiment of the present invention, register RB may be loaded with a different value than loaded in register EA. Register RA may be loaded with either the same or a different value than loaded in register RB thereby enabling selector circuits 102 to be tested using a unique pattern as described above.

For example, referring to FIG. 5, register RB may be loaded with the same value as stored in each entry in the memory array corresponding to the value of 00000000. Register RA may also be loaded with the same value of 0000000 in its "initial state" in order to test case "a." Initial state as used herein may refer to the state where RA is loaded with an initial value. During the initial state, a match condition is tested as described further below. As further discussed below, the value stored in RA may be updated to test various sets 201 during which mismatching occurs until reaching a "final state." The final state as used herein may refer to the state where RA is loaded with a final value. During the final state, a match condition is tested as described further below.

Referring to FIG. 6, register RB is loaded with the same value as stored in each entry in the memory array corresponding to the value of 01010101. Register RA is loaded with a different value of 0000000 in its initial state in order to test cases "3" and "c" as described above. Referring to FIG. 7, register RB is loaded with the same value as stored in each entry in the memory array corresponding to the value of 10101010. Register RA is loaded with a different value of 0000000 in its initial state in order to test cases "3" and "c" as described above. Referring to FIG. 8, register RB is loaded with the same value as stored in each entry in the memory array corresponding to the value of 10101010. Register RA is loaded with a different value of 0000000 in its initial state in order to test case "2." It is noted that registers RA and RB may be any length and that the value loaded in registers RA and RB may be a different length than illustrated.

Returning to FIG. 4, in step 404, the values stored in the n-most significant bits, e.g., 8-bits, 52-bits, in registers RA and RB, may be pre-decoded into a value commonly referred to as a predecode value (also referred to as e00, e01, e10 and e11 elsewhere). That is, the values stored in the n-most significant bits, e.g., 8-bits, 52-bits, in registers RA and RB may be decoded into an n-most significant bit value. In one embodiment, the pre-decoding may occur by a unit configured similarly as predecode unit 101. In step 405, the predecode value may be compared with the value stored in the n-most significant bits, e.g., 8-bits, 52-bits, in a particular entry in the memory array.

In step 406, during the initial state, a determination may be made as to whether a match occurred. If there was not a match between the value stored in the n-most significant bits in the particular entry in the memory array with the predecode value, then a stuck-at-fault was detected for the case tested on selector circuits 102 in step 407.

For example, referring to FIG. 5 which illustrates testing case "a" of Table 3 during the initial state, if there was not a match between the value stored in the n-most significant bits in the particular entry in the memory array with the predecode value, then, in a single stuck-at-fault scenario, either transistor 202A in one or more sets 201A or transistor 2021 in one or more sets 201C failed to be deactivated thereby causing the pulling down of line 104. Referring to FIG. 6 which illustrates testing case "c" of Table 3 for the evenly located selector circuits 102 and testing case "3" of Table 3 for the oddly located selector circuits 102 during the initial state, if there was not a match between the value stored in the n-most significant bits in the particular entry in the memory array with the predecode value, then either transistor 202C in one or more evenly located sets 201A, transistor 202G in one or more evenly located sets 201C, transistor 202B in one or more oddly located sets 201A, transistor 202D in one or more oddly located sets 201B, or transistor 202K in one or more oddly located sets 201D failed to be deactivated thereby causing the pulling down of line 104. Referring to FIG. 7 which illustrates testing case "c" of Table 3 for the oddly located selector circuits 102 and testing case "3" of Table 3 for the evenly located selector circuits 102 during the initial state, if there was not a match between the value stored in the n-most significant bits in the particular entry in the memory array with the predecode value, then either transistor 202C in one or more oddly located sets 201A, transistor 202G in one or more oddly located sets 201C, transistor 202B in one or more evenly located sets 201A, transistor 202D in one or more evenly located sets 201B, or transistor 202K in one or more evenly located sets 201D failed to be deactivated thereby causing the pulling down of line 104. Referring to FIG. 8 which illustrates testing case "2" of Table 3 during the initial state, if there was not a match between the value stored in the n-most significant bits in the particular entry in the memory array with the predecode value, then either transistor 202E in one or more sets 201B, transistor 202H in one or more sets 201C or transistor 202J in one or more sets 201D failed to be deactivated thereby causing the pulling down of line 104.

Returning to step 406 of FIG. 4, if, however, there was a match between the value stored in the n-most significant bits in the particular entry in the memory array with the predecode value, then, in step 408, a carry-in bit may be shifted by one bit position to the left in the register RA to test for mismatching. The updated value stored in the n-most significant bits, e.g., 8-bits, 52-bits, in register RA resulting from the shifting and the value stored in the n-most significant bits in register RB may be predecoded in step 409. In step 410, the updated predecode value may be compared with the value stored in the n-most significant bits, e.g., 8-bits, 52-bits, in the particular entry in the memory array.

In step 411, a determination may be made as to whether a mismatch occurred. That is, a determination may be made as to whether the appropriate set 201 in a particular selector circuit 102 was activated to pull down line 104. If there was a match between the value stored in the n-most significant bits in the particular entry in the memory array with the updated predecode value of step 409, then a stuck-at-fault was detected for the case tested on selector circuits 102 in step 412.

For example, referring to FIG. 5 which illustrates testing set 201A in a particular selector circuit 102 for mismatching, if there was a match between the value stored in the n-most significant bits in the particular entry in the memory array with the updated predecode value of step 409, then an appropriate set 201A in a particular selector circuit 102 failed to be activated thereby failing to pull down line 104. In one embodiment, set 201A is tested in selector circuit 102 that is associated with predecode unit 101 that receives the value in the RA field bit position to the left of the carry-in bit as well as the value in the corresponding bit position in the RB field. As stated above, each predecode unit 101, e.g., predecode unit 101A, receives a value in particular bit positions, e.g., two-most significant bit positions, in the RA and RB fields. Each predecode unit 101, e.g., predecode 101A, decodes the received bits into signals e00, e01, e10 and e11 which are then inputted to a corresponding selector circuit 102, e.g., selector circuit 102A. Other sets 201 are similarly tested for mismatching as illustrated in FIGS. 6–8.

Referring to FIG. 6 which illustrates testing either set 201B or set 201C for mismatching, if there was a match between the value stored in the n-most significant bits in the particular entry in the memory array with the updated predecode value of step 409, then either set 201B or set 201C in a particular selector circuit 102 failed to be activated thereby failing to pull down line 104. In one embodiment, set 201B or set 201C is tested in selector circuit 102 that is associated with predecode unit 101 that receives the value in the RA field bit position to the left of the carry-in bit as well as the value in the corresponding bit position in the RB field. Set 201B is tested in selector circuits 102 located in the even position, e.g., zero position, second position, fourth position, etc. Set 201C is tested in selector circuits 102 located in the odd position, e.g., first position, third position, etc. Similarly, FIG. 7 illustrates testing either set 201B or set 201C for correctly identifying a mismatch. However, set 201B is tested in selector circuits 102 located in the odd position and set 201C is tested in selector circuits 102 located in the odd position in FIG. 7. Referring to FIG. 8 which illustrates testing of set 201D in a particular selector circuit 102 for mismatching, if there was a match between the value stored in the n-most significant bits in the particular entry in the memory array with the updated predecode value of step 409, then an appropriate set 201D in a particular selector circuit 102 failed to be activated thereby failing to pull down line 104. In one embodiment, set 201D is tested in selector circuit 102 that is associated with predecode unit 101 that receives the value in the RA field bit position to the left of the carry-in bit as well as the value in the corresponding bit position in the RB field.

Returning to step 411 of FIG. 4, if, however, there was a mismatch between the value stored in the n-most significant bits in the particular entry of the memory array with the updated predecode value of step 409, then a determination may be made as to whether the second to the last iteration is complete in step 413. That is, a determination may be made as to whether the carry-in bit is located in the second to the n-most significant bit position in register RA.

If the carry-in bit is not located in the second to the n-most significant bit position in register RA, then, in step 408, a carry-in bit may be shifted by one bit position to the left in register RA to perform the next iteration for testing for mismatching.

If, however, the carry-in bit is located in the second to the n-most significant bit position in register RA, then a carry-in bit may be shifted by one bit position to the left in register RA to be located in the most significant bit position in step 414. The updated value stored in the n-most significant bits, e.g., 8-bits, 52-bits, in register RA resulting from the shifting and the value stored in the n-most significant bits in register RB may be predecoded in step 415. In step 416, the updated predecode value of step 415 may be compared with the value stored in the n-most significant bits, e.g., 8-bits, 52-bits, in the particular entry in the memory array.

In step 417, a determination may be made as to whether a match occurred. If there was not a match between the value stored in the n-most significant bits in the particular entry in the memory array with the updated predecode value of step 415, then a stuck-at-fault was detected for the case tested on selector circuits 102 in step 418.

For example, referring to FIG. 5 which illustrates testing case "1" in Table 3 during the final state, if there was not a match between the value stored in the n-most significant bits in the particular entry in the memory array with the updated predecode value of step 415, then, in a single stuck-at-fault scenario, either transistor 202A in one or more sets 201A, transistor 202F in one or more sets 201B or transistor 202I in one or more sets 201C failed to be deactivated thereby causing the pulling down of line 104. Referring to FIG. 6 which illustrates testing case "b" in Table 3 for the evenly located selector circuits 102 and testing case "4" in Table 3 for the oddly located selector circuits 102 during the final state, if there was not a match between the value stored in the n-most significant bits in the particular entry in the memory array with the updated predecode value of step 415, then either transistor 202D in one or more evenly located sets 201B, transistor 202K in one or more evenly located sets 201D, transistor 202C in one or more oddly located sets 201A, transistor 202G in one or more oddly located sets 201C or transistor 202L in one or more oddly located sets 201D failed to be deactivated thereby causing the pulling down of line 104. Referring to FIG. 7 which illustrates testing case "b" in Table 3 for the oddly located selector circuits 102 and testing case "4" in Table 3 for the evenly located selector circuits 102 during the final state, if there was not a match between the value stored in the n-most significant bits in the particular entry in the memory array with the updated predecode value of step 415, then either transistor 202D in one or more oddly located sets 201B, transistor 202K in one or more oddly located sets 201D, transistor 202C in one or more evenly located sets 201A, transistor 202G in one or more evenly located sets 201C or transistor 202L in one or more evenly located sets 201D failed to be deactivated thereby causing the pulling down of line 104. Referring to FIG. 8 which illustrates testing case "d" of Table 3 during the final state, if there was not a match between the value stored in the n-most significant bits in the particular entry in the memory array with the updated predecode value of step 415, then either transistor 202E in set 201B or transistor 202J in set 201D failed to be deactivated thereby causing the pulling down of line 104.

Returning to step 417 of FIG. 4, if, however, there was a match between the value stored in the n-most significant bits in the particular entry of the memory array with the updated predecode value of step 415, then method 400 is terminated in step 419.

It is noted that method 400 may be executed in a different order presented and that the order presented in the discussion of FIG. 4 is illustrative. It is further noted that certain steps in FIG. 4 may be executed almost concurrently. It is further noted that method 400 may be executed by a program of the present invention in a computer system as described below in conjunction with FIG. 9.

Figure 9:
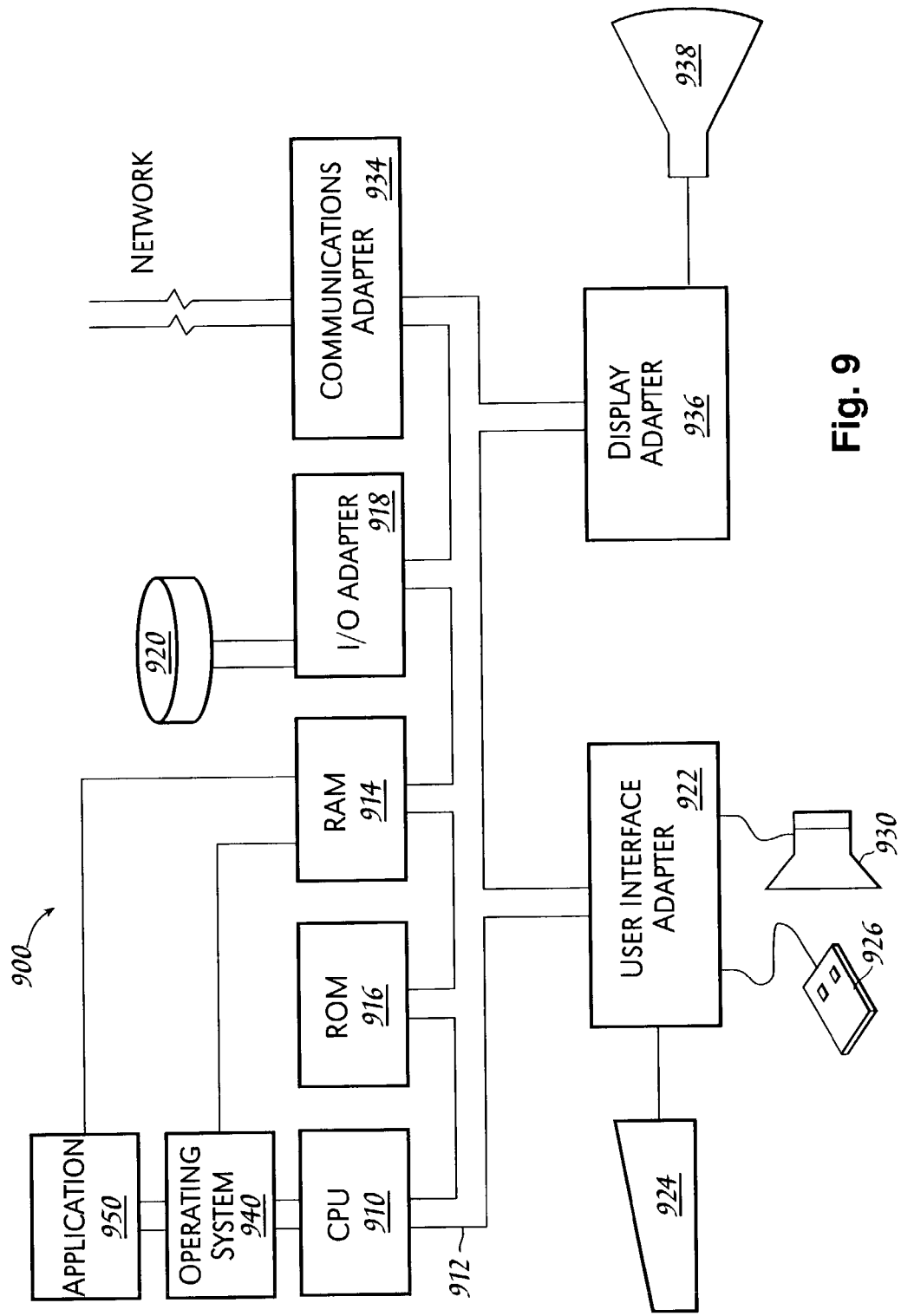
FIG. 9 illustrates a computer system configured in accordance with the present invention.

FIG. 9—Hardware Configuration of Computer System

FIG. 9 illustrates a typical hardware configuration of computer system 900 which is representative of a hardware environment for practicing the present invention. Computer 900 may have a central processing unit 910 coupled to various other components by system bus 912. An operating system 940 may run on CPU 910 and provide control and coordinate the functions of the various components of FIG. 9. An application 950 in accordance with the principles of the present invention may run in conjunction with operating system 940 and provide calls to operating system 940 where the calls implement the various functions or services to be performed by application 950. Application 950 may include, for example, a program for generating a test pattern used to test stuck-at-faults in selector circuits 102 (FIGS. 1 and 2) as described above in conjunction with FIG. 3 as well as testing stuck-at-faults in selector circuits 102 as discussed above in conjunction with FIG. 4. Read-Only Memory (ROM) 916 may be coupled to system bus 912 and include a basic input/output system ("BIOS") that controls certain basic functions of computer system 900. Random access memory (RAM) 914 and Input/Output (I/O) adapter 918 may also be coupled to system bus 912. It should be noted that software components including operating system 940 and application 950 may be loaded into RAM 914 which may be computer system's 900 main memory for execution. I/O adapter 918 may be a small computer system interface ("SCSI") adapter that communicates with a disk unit 920, e.g., disk drive. It is noted that the program of the present invention that generates a test pattern used to test stuck-at-faults in selector circuits 102 as described above in conjunction with FIG. 3 as well as test stuck-at-faults in selector circuits 102 as described above in conjunction with FIG. 4 may reside in disk unit 920 or in application 950.

Referring to FIG. 9, computer system 900 may further comprise a communications adapter 934 coupled to bus 912. Communications adapter 934 may be configured to interconnect bus 912 with an outside network enabling computer system 900 to communicate with other such systems. I/O devices may also be connected to system bus 912 via a user interface adapter 922 and a display adapter 936. Keyboard 924, mouse 926 and speaker 930 may all be interconnected to bus 912 through user interface adapter 922. Event data may be inputted to computer system 900 through any of these devices. A display monitor 938 may be connected to system bus 912 by display adapter 936. In this manner, a user is capable of inputting to computer system 900 through keyboard 924 or mouse 926 and receiving output from computer system 900 via display 938.

Implementations of the invention include implementations as a computer system programmed to execute the method or methods described herein, and as a computer program product. According to the computer system implementations, sets of instructions for executing the method or methods are resident in the random access memory 914 of one or more computer systems configured generally as described above. Until required by computer system 900, the set of instructions may be stored as a computer program product in another computer memory, for example, in disk drive 920 (which may include a removable memory such as an optical disk or floppy disk for eventual use in disk drive 920). Furthermore, the computer program product can also be stored at another computer and transmitted when desired to the user's workstation by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change.

Although the system, computer program product and method are described in connection with several embodiments, it is not intended to be limited to the specific forms set forth herein; but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

The invention claimed is:

1. A method for testing stuck-at-faults in circuitry configured to determine matching of memory cell contents comprising the steps of:

loading a first register with a first value, wherein said first register is configured to store contents for a row of a memory array;

writing said first value into an entry in said memory array;
loading a second register with a second value;
loading a third register with one of said second value and a third value, wherein said second and said third values are pre-selected to test selector circuits for stuck-at-faults with a pattern, wherein said selector circuits are configured to determine matching of memory cell contents in said memory array, wherein said pattern comprises a first set of bits to be inputted to said selector circuits, wherein said pattern further comprises a second set of bits to be stored in memory cells embedded with said selector circuits;
predecoding a value stored in n-most significant bits of said second register and a value stored in n-most significant bits of said third register to produce a predecode value;
comparing said predecode value with a value stored in n-most significant bits of said entry in said memory array; and
determining if a stuck-at-fault occurred based on said comparison.

2. The method as recited in claim 1, wherein said second value is equal to said first value.

3. The method as recited in claim 1 further comprising the steps of:
shifting a carry-in bit in a predetermined direction to a first one of said n-most significant bits of said third register;
predecoding said value stored in said n-most significant bits of said second register and an updated value stored in said n-most significant bits of said third register resulting from said shifting step to produce an updated predecode value;
comparing said updated predecode value with said value stored in said n-most significant bits of said entry in said memory array; and
determining if said stuck-at-fault occurred based on said comparison.

4. The method as recited in claim 3, wherein if said stuck-at-fault did not occur then the method further comprises the steps of:
shifting said carry-in bit in said predetermined direction to a second one of said n-most significant bits of said third register;
predecoding said value stored in said n-most significant bits of said second register and an updated value stored in said n-most significant bits of said third register resulting from said shifting step to produce an updated predecode value;
comparing said updated predecode value with said value stored in said n-most significant bits of said entry in said memory array; and
determining if said stuck-at-fault occurred based on said comparison.

5. The method as recited in claim 4, where each of said selector circuits comprises a plurality of sets of serially connected transistors, wherein said stuck-at-fault is determined if a selected set does not pull down a line indicating a mismatch occurred.

6. The method as recited in claim 3, wherein if said stuck-at-fault did not occur then the method further comprises the step of:
determining if said carry-in bit is in a second to most significant bit position in said third register.

7. The method as recited in claim 5, wherein if said carry-in bit is in said second to most significant bit position in said third register then the method further comprises the steps of:
shifting said carry-in bit to the most significant bit position in said third register;
predecoding said value stored in said n-most significant bits of said second register and an updated value stored in said n-most significant bits of said third register resulting from said shifting step to produce an updated predecode value;
comparing said predecode value with said value stored in said n-most significant bits of said entry in said memory array; and
determining if said stuck-at-fault occurred based on said comparison.

8. The method as recited in claim 7, wherein said stuck-at-fault is determined if there is not a match between said updated predecode value with said value stored in said n-most significant bits of said entry in said memory array.

9. The method as recited in claim 3, where each of said selector circuits comprises a plurality of sets of serially connected transistors, wherein said stuck-at-fault is determined if a selected set does not pull down a line indicating a mismatch occurred.

10. The method as recited in claim 1, wherein said stuck-at-fault is determined if there is not a match between said predecode value with said value stored in said n-most significant bits of said entry in said memory array.

11. The method as recited in claim 1 further comprising:
generating said pattern, wherein said pattern is generated by:
determining patterns of inputs to a selector circuit, wherein said selector circuit comprises a plurality of sets of serially connected transistors;
tracking which sets in said selector circuit have only a single transistor deactivated upon applying said patterns of inputs to said selector circuit and applying pre-selected sets of bits in the contents of memory cells embedded with said selector circuit; and
tracking which sets in said selector circuit have all transistors activated upon applying said patterns of inputs to said selector circuit and applying pre-selected sets of bits in the contents of memory cells embedded with said selector circuit.

12. The method as recited in claim 11, wherein said generation of said pattern further comprises the step of:
generating a table indicating which sets in said selector circuit have only said single transistor deactivated and which sets have all transistors activated for each of said patterns of inputs to said selector circuit and for each of said pre-selected sets of bits in the contents of memory cells embedded with said selector circuit.

13. A computer program product embodied in a machine readable medium for testing stuck-at-faults in circuitry configured to determine matching of memory cell contents comprising the programming steps of:
loading a first register with a first value, wherein said first register is configured to store contents for a row of a memory array;
writing said first value into an entry in said memory array;
loading a second register with a second value;
loading a third register with one of said second value and a third value, wherein said second and said third values are pre-selected to test selector circuits for stuck-at-faults with a pattern, wherein said selector circuits are configured to determine matching of memory cell contents in said memory array, wherein said pattern comprises a first set of bits to be inputted to said selector circuits, wherein said pattern further comprises a second set of bits to be stored in memory cells embedded with said selector circuits;

predecoding a value stored in n-most significant bits of said second register and a value stored in n-most significant bits of said third register to produce a predecode value;

comparing said predecode value with a value stored in n-most significant bits of said entry of said memory array; and determining if a stuck-at-fault occurred based on said comparison.

14. The computer program product as recited in claim 13, wherein said second value is equal to said first value.

15. The computer program product as recited in claim 13 further comprising the programming steps of:

shifting a carry-in bit in a predetermined direction to a first one of said n-most significant bits of said third register;

predecoding said value stored in said n-most significant bits of said second register and an updated value stored in said n-most significant bits of said third register resulting from said shifting step to produce an updated predecode value;

comparing said updated predecode value with said value stored in said n-most significant bits of said entry in said memory array; and determining if said stuck-at-fault occurred based on said comparison.

16. The computer program product as recited in claim 15, wherein if said stuck-at-fault did not occur then the computer program product further comprises the programming steps of:

shifting said carry-in bit in said predetermined direction to a second one of said n-most significant bits of said third register;

predecoding said value stored in said n-most significant bits of said second register and an updated value stored in said n-most significant bits of said third register resulting from said shifting step to produce an updated predecode value;

comparing a result of said addition with said value stored in said n-most significant bits of said entry in said memory array; and determining if said stuck-at-fault occurred based on said comparison.

17. The computer program product as recited in claim 16, where each of said selector circuits comprises a plurality of sets of serially connected transistors, wherein said stuck-at-fault is determined if a selected set does not pull down a line indicating a mismatch occurred.

18. The computer program product as recited in claim 15, wherein if said stuck-at-fault did not occur then the computer program product further comprises the programming step of:

determining if said carry-in bit is in a second to most significant bit position in said third register.

19. The computer program product as recited in claim 18, wherein if said carry-in bit is in said second to most significant bit position in said third register then the computer program product further comprises the programming steps of:

shifting said carry-in bit to the most significant bit position in said third register;

predecoding said value stored in said n-most significant bits of said second register and an updated value stored in said n-most significant bits of said third register resulting from said shifting step to produce an updated predecode value;

comparing said predecode value with said value stored in said n-most significant bits of said entry in said memory array; and determining if said stuck-at-fault occurred based on said comparison.

20. The computer program product as recited in claim 19, wherein said stuck-at-fault is determined if there is not a match between said updated predecode value with said value stored in said n-most significant bits of said entry in said memory array.

21. The computer program product as recited in claim 15, where each of said selector circuits comprises a plurality of sets of serially connected transistors, wherein said stuck-at-fault is determined if a selected set does not pull down a line indicating a mismatch occurred.

22. The computer program product as recited in claim 13, wherein said stuck-at-fault is determined if there is not a match between said predecode value with said value stored in said n-most significant bits of said entry in said memory array.

23. The computer program product as recited in claim 13 further comprising the programming steps:

generating said pattern, wherein said pattern is generated by the programming steps:

determining patterns of inputs to a selector circuit, wherein said selector circuit comprises a plurality of sets of serially connected transistors;

tracking which sets in said selector circuit have only a single transistor deactivated upon applying said patterns of inputs to said selector circuit and applying pre-selected sets of bits in the contents of memory cells embedded with said selector circuit; and tracking which sets in said selector circuit have all transistors activated upon applying said patterns of inputs to said selector circuit and applying pre-selected sets of bits in the contents of memory cells embedded with said selector circuit.

24. The computer program product as recited in claim 23, wherein said generation of said pattern further comprises the programming step of:

generating a table indicating which sets in said selector circuit have only said single transistor deactivated and which sets have all transistors activated for each of said patterns of inputs to said selector circuit and for each of said pre-selected sets of bits in the contents of memory cells embedded with said selector circuit.

25. A system, comprising:

a memory unit operable for storing a computer program for testing stuck-at-faults in circuitry configured to determine matching of memory cell contents; and a processor coupled to said memory unit, wherein said processor, responsive to said computer program, comprises:

circuitry operable for loading a first register with a first value, wherein said first register is configured to store contents for a row of a memory array;

circuitry operable for writing said first value into an entry in said memory array;

circuitry operable for loading a second register with a second value;

circuitry operable for loading a third register with one of said second value and a third value, wherein said second and said third values are pre-selected to test selector circuits for stuck-at-faults with a pattern, wherein said selector circuits are configured to determine matching of memory cell contents in said memory array, wherein said pattern comprises a first set of bits to be inputted to said selector circuits, wherein said pattern further comprises a second set of bits to be stored in memory cells embedded with said selector circuits;

circuitry operable for predecoding a value stored in n-most significant bits of said second register and a value stored in n-most significant bits of said third register to produce a predecode value;

circuitry operable for comparing said predecode value with a value stored in n-most significant bits of said entry in said memory array; and circuitry operable for determining if a stuck-at-fault occurred based on said comparison.

26. The system as recited in claim 25, wherein said second value is equal to said first value.

27. The system as recited in claim 25, wherein said processor further comprises:

circuitry operable for shifting a carry-in bit in a predetermined direction to a first one of said n-most significant bits of said third register;

circuitry operable for predecoding said value stored in said n-most significant bits of said second register and an updated value stored in said n-most significant bits of said third register resulting from said shifting step to produce an updated predecode value;

circuitry operable for comparing said updated predecode value with said value stored in said n-most significant bits of said entry in said memory array; and circuitry operable for determining if said stuck-at-fault occurred based on said comparison.

28. The system as recited in claim 27, wherein if said stuck-at-fault did not occur then said processor further comprises:

circuitry operable for shifting said carry-in bit in said predetermined direction to a second one of said n-most significant bits of said third register;

circuitry operable for predecoding said value stored in said n-most significant bits of said second register and an updated value stored in said n-most significant bits of said third register resulting from said shifting step to produce an updated predecode value;

circuitry operable for comparing said predecode value with said value stored in said n-most significant bits of said entry in said memory array; and circuitry operable for determining if said stuck-at-fault occurred based on said comparison.

29. The system as recited in claim 28, where each of said selector circuits comprises a plurality of sets of serially connected transistors, wherein said stuck-at-fault is determined if a selected set does not pull down a line indicating a mismatch occurred.

30. The system as recited in claim 27, wherein if said stuck-at-fault did not occur then said processor further comprises:

circuitry operable for determining if said carry-in bit is in a second to most significant bit position in said third register.

31. The system as recited in claim 30, wherein if said carry-in bit is in said second to most significant bit position in said third register then said processor further comprises:

circuitry operable for shifting said carry-in bit to the most significant bit position in said third register;

circuitry operable for predecoding said value stored in said n-most significant bits of said second register and an updated value stored in said n-most significant bits of said third register resulting from said shifting step to produce an updated predecode value;

circuitry operable for comparing said updated predecode value with said value stored in said n-most significant bits of said entry in said memory array; and circuitry operable for determining if said stuck-at-fault occurred based on said comparison.

32. The system as recited in claim 31, wherein said stuck-at-fault is determined if there is not a match between said updated predecode value with said value stored in said n-most significant bits of said entry in said memory array.

33. The system as recited in claim 27, where each of said selector circuits comprises a plurality of sets of serially connected transistors, wherein said stuck-at-fault is determined if a selected set does not pull down a line indicating a mismatch occurred.

34. The system as recited in claim 25, wherein said stuck-at-fault is determined if there is not a match between said predecode value with said value stored in said n-most significant bits of said entry in said memory array.

35. The system as recited in claim 25, wherein said processor further comprises:

circuitry operable for generating said pattern, wherein said circuitry operable for generating said pattern comprises:

circuitry operable for determining patterns of inputs to a selector circuit, wherein said selector circuit comprises a plurality of sets of serially connected transistors;

circuitry operable for tracking which sets in said selector circuit have only a single transistor deactivated upon applying said patterns of inputs to said selector circuit and applying pre-selected sets of bits in the contents of memory cells embedded with said selector circuit; and circuitry operable for tracking which sets in said selector circuit have all transistors activated upon applying said patterns of inputs to said selector circuit and applying pre-selected sets of bits in the contents of memory cells embedded with said selector circuit.

36. The system as recited in claim 35, wherein said circuitry operable for generating said pattern further comprises:

circuitry operable for generating a table indicating which sets in said selector circuit have only said single transistor deactivated and which sets have all transistors activated for each of said patterns of inputs to said selector circuit and for each of said pre-selected sets of bits in the contents of memory cells embedded with said selector circuit.

* * * * *